(12) United States Patent
Bogner et al.

(10) Patent No.: US 9,236,878 B2
(45) Date of Patent: Jan. 12, 2016

(54) ANALOG-TO-DIGITAL CONVERSION

(71) Applicant: Infineon Technologies AG, Neubiberg (DE)

(72) Inventors: Peter Bogner, Wernberg (AT); Herwig Wappis, Drobollach (AT); Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 45 days.

(21) Appl. No.: 14/181,150

(22) Filed: Feb. 14, 2014

(65) Prior Publication Data

US 2015/0236710 A1     Aug. 20, 2015

(51) Int. Cl.
| | | |
|---|---|---|
| *H03M 1/00* | (2006.01) | |
| *H03M 1/12* | (2006.01) | |
| *H03M 1/18* | (2006.01) | |
| *H03M 1/44* | (2006.01) | |

(52) U.S. Cl.
CPC ............ *H03M 1/1295* (2013.01); *H03M 1/002* (2013.01); *H03M 1/186* (2013.01); *H03M 1/44* (2013.01); *H03M 1/00* (2013.01); *H03M 1/12* (2013.01)

(58) Field of Classification Search
CPC .................................. H03M 1/00; H03M 1/12
USPC .................. 341/122, 163, 155, 156, 158, 110
See application file for complete search history.

(56) References Cited

U.S. PATENT DOCUMENTS

| | | | |
|---|---|---|---|
| 4,751,673 | A | 6/1988 | Agarwal et al. |
| 5,016,018 | A | 5/1991 | Chang et al. |
| 5,581,254 | A | 12/1996 | Rundel |
| 7,123,894 | B2 | 10/2006 | Hessel et al. |
| 7,411,533 | B2 | 8/2008 | Posamentier |
| 7,460,615 | B2 | 12/2008 | Kunysz et al. |
| 7,796,069 | B2 | 9/2010 | Li |
| 8,004,435 | B2 | 8/2011 | Waki et al. |
| 2008/0143576 | A1* | 6/2008 | Chen et al. ..................... 341/162 |
| 2010/0245143 | A1 | 9/2010 | Stanley et al. |
| 2013/0201043 | A1* | 8/2013 | Wong et al. ................... 341/122 |
| 2014/0002286 | A1 | 1/2014 | Bogner et al. |

OTHER PUBLICATIONS

Office Action dated Jul. 23, 2013 for U.S. Appl. No. 13/539,658.
Office Action dated Dec. 18, 2013 for U.S. Appl. No. 13/539,658.

* cited by examiner

*Primary Examiner* — Joseph Lauture
(74) *Attorney, Agent, or Firm* — Eschweiler & Associates, LLC

(57) ABSTRACT

A method is disclosed. An analog signal is sampled to form a sample value using a sample and hold circuit. The sample value is converted to form a first digital result. The sample value is converted to form a second digital result.

21 Claims, 6 Drawing Sheets

ANALOG-TO-DIGITAL CONVERSION

BACKGROUND

In microcontroller applications (e.g., industrial, automotive, aeronautical, etc.), analog signals may be converted to digital form and processed concurrently. For example, in such applications, multiple sensors may provide information about various aspects of complex systems, with the sensors providing analog signals at their output. With evolution in various technologies, an increasing number of analog channels are desired to be converted to a digital form concurrently for processing. In some cases, multiple analog channels may each carry multiple analog signals from multiple sources, for example.

The increasing number of analog input signals for analog-to-digital conversion can lead to a high degree of complexity regarding the sequence of conversions or to an increased area, especially if various analog input signals have to be sampled at specific points in time, which may even differ from signal to signal.

In many scenarios, the number of independent ADC modules is increased to allow independent sampling and conversion of groups of analog signals. This also increases the costs and complexity.

Typically, an increase in the quantity of analog signals to be processed results in the deployment of an increased number of analog-to-digital converters (ADCs). However, this increase in the number of ADCs increases the amount of area consumed to provide the ADCs for the application, as well as the amount of energy consumed to power them.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Overview

Representative implementations of devices and techniques provide analog to digital conversion of multiple parallel analog inputs. An input interface is arranged to serially organize the multiple parallel analog inputs and an analog-to-digital converter (ADC) is arranged to sequentially convert the multiple parallel analog inputs to digital results. In one implementation, a single ADC is used to convert analog signals from multiple channels to digital form.

In one example implementation, the interface is comprised of passive components. For example, no active components (e.g., amplifiers, etc.) are used in the implementation of the interface. In another example implementation, a demultiplexer component is arranged to direct outputs of the ADC to one or more parallel output channels.

The examples described herein may be applicable for various kinds of analog to digital conversion arrangements. Techniques and devices are discussed with reference to exemplary analog-to-digital converter (ADC) devices or systems. Embodiments may in particular refer to successive-approximation ADC (SA-ADC) designs, to any of various ADC device designs, structures, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.).

Example implementations are explained in more detail below using a plurality of examples. Although various implementations and examples are discussed here and below, further implementations and examples may be possible by combining the features and elements of individual implementations and examples.

A method is disclosed. An analog signal is sampled at a sample and hold circuit to form a sample value. The sample value is converted to form a first digital result. The sample value is converted to form a second digital result.

A device includes a sample and hold circuit and a processing unit. The sample and circuit is configured to form a sample value based on an analog signal. The processing unit is arranged to/for converting the sample value to form a first digital result and to/for converting the sample value to form a second digital result.

A device for providing digital results based on an analog signal is disclosed. The device includes a means for sampling the analog signal at a sample and hold circuit to form a sample value, a means for converting the sample value to form a first digital result, and a means for converting the sample value to form a second digital result.

Example

Parallel ADC Arrangement

Figure 1:
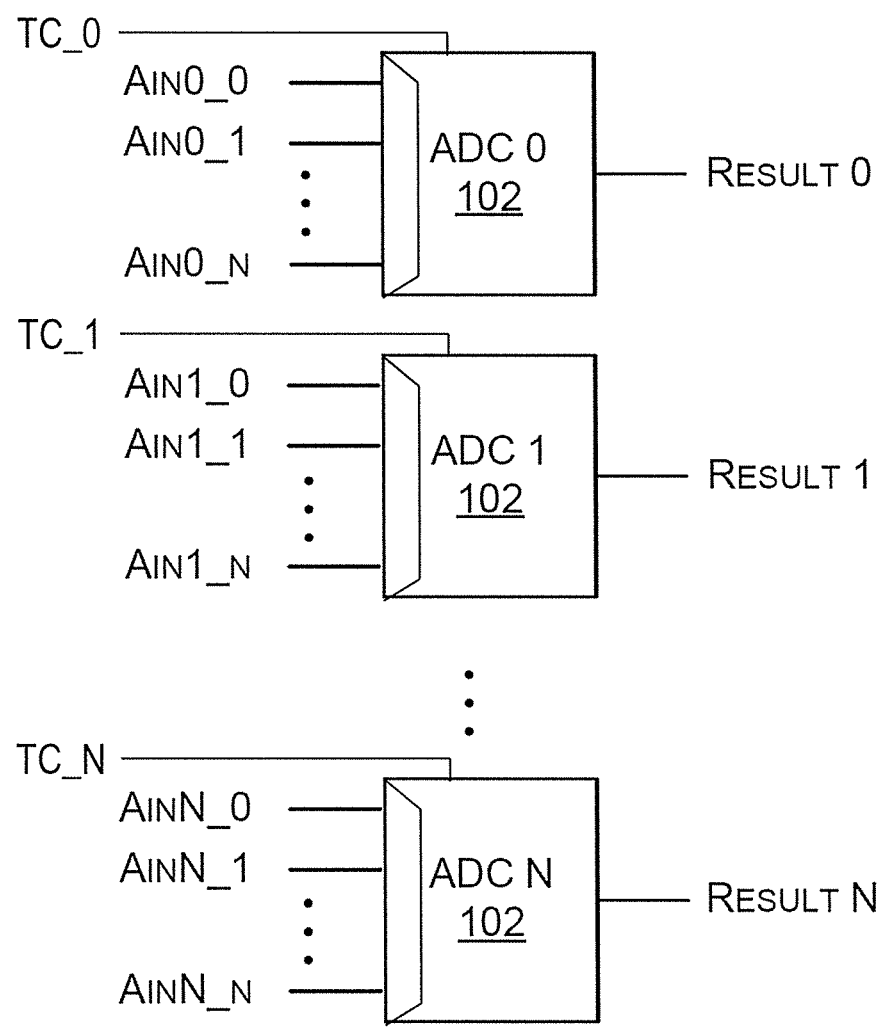
FIG. 1 is a block diagram of an example parallel analog-to-digital conversion arrangement, according to an example implementation.

FIG. 1 shows a block diagram of an example parallel analog-to-digital conversion (ADC) arrangement 100, wherein the techniques, methods and devices described herein may be applied. Analog signals (Ain0_0 through AinN_N) are received on the input side, converted by a several ADCs 102 (ADC 0 through ADC N), and digital result channels (Result 0, Result 1, and Result N) are output from the ADCs 102. In various implementations, any number of analog inputs (Ain0_0 through AinN_N) may be received by any number of ADCs 102. Further, one or more digital result channels (Result 0 to Result N) may be output by one or more of the ADCs 102. In various implementations, a number of ADCs 102

(ADC 0 to ADC N) and/or a number of digital result channels (Result 0 to Result N) may be determined by a number of inputs available to a device or system (e.g., controller, processor, etc.) receiving the converted digital result channels (Result 0 to Result N).

A digital result may be described as a digital approximation of an analog input. For example, a digital result may include a digital representation that is proportional to the magnitude of a voltage or a current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, the parallel ADC arrangement 100 may include a quantity of ADCs 102 arranged in parallel. Each ADC may represent a channel, with some of the analog inputs (e.g., Ain0_0 through Ain0_N) associated with the channel, one or more of the ADCs 102 (e.g., ADC 0) associated with the channel, and one or more corresponding outputs (e.g., result channel Result 0) also associated with the channel. In alternate implementations, a parallel ADC arrangement 100 may include fewer, additional, or alternate components.

It is noted that each of the ADCs 102 may have the same number of input signals; however, at least some of the ADCs 102 may have a different number of input signals X, Y and Z (i.e., Ain0_X, Ain1_Y, AinN_Z).

In another example, a timing control signal is conveyed to each of the ADCs 102, i.e. a timing control signal TC_0 is conveyed to the ADC 0, a timing control signal TC_1 is conveyed to the ADC 1 and a timing control signal TC_N is conveyed to the ADC N.

Example

Serial ADC Arrangement

Hereinafter the serial ADC arrangement is in particular directed to an ADC arrangement for sequential conversions.

Figure 2:
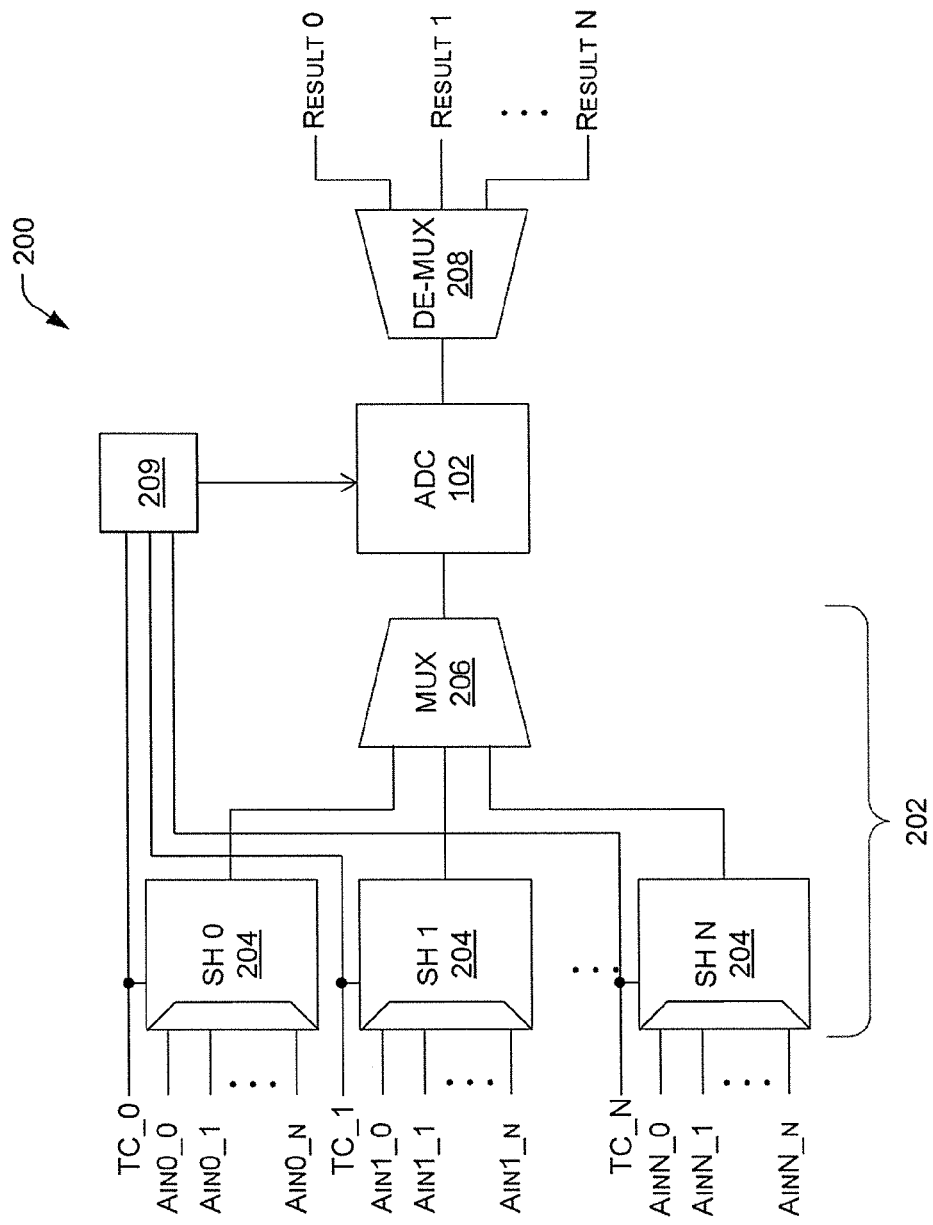
FIG. 2 is a block diagram of an example serial analog-to-digital conversion arrangement, including an input interface and an output demultiplexer, according to an example implementation.

FIG. 2 is a block diagram of an example serial analog-to-digital conversion (ADC) arrangement 200. In the example implementation, an interface 202 and a single ADC 102 may be substituted for some or all of the quantity of parallel ADCs 102 in a parallel ADC arrangement 100. For example, in an application where one or more analog channels with multiple concurrent analog input signals are to be converted to digital results, a single ADC 102 may be employed to convert the multiple input signals, with an interface 202 arranged to serially organize the multiple parallel analog inputs. In various other implementations, combinations of one or more serial ADC arrangements 200 with one or more parallel ADC arrangements 100 may be used. Employing a serial ADC arrangement 200 in place of a parallel ADC arrangement 100 has advantages of space (i.e., circuit area) savings and power savings, among others.

In an implementation, as shown in FIG. 2, an example serial ADC arrangement 200 comprises a quantity of sample and hold (SH) circuits 204, a multiplexer circuit (MUX) 206, and an ADC 102. The SH circuits 204 are arranged to receive analog input signals and sample the signals, outputting the sample value. The MUX circuit 206 is arranged to receive the outputs from the SH circuits 204 and multiplex them into a sequential form, e.g., on a single channel. The ADC 102 may receive the sample values sequentially from the MUX circuit 206, and convert the sample values in a sequential order into digital results. In one example, the digital results remain in a sequential form as output from the ADC 102, e.g., one result after the other according to the sequence of conversions.

In a further example implementation, the serial ADC arrangement 200 additionally includes a demultiplexer (DE-MUX) 208. If included, the DE-MUX 208 de-multiplexes a common result channel from the ADC 102, and restores the digital outputs to multiple result channels (Result 0 to Result N). A digital output that is a result of an analog input from one of the SH circuits 204 is directed to a result channel associated with that SH circuit 204, and so on for each of the digital results. Accordingly, each result channel may include at least one SH circuit 204 and at least one associated output (e.g., result).

As discussed above, the techniques, components, and devices described herein with respect to the serial ADC arrangement 200 are not limited to the illustration in FIG. 2, and may be applied to other ADC devices and designs without departing from the scope of the disclosure. In some cases, additional or alternative components may be used to implement the techniques described herein. Further, the components may be arranged and/or combined in various combinations, while resulting in digital result channels (Result 0 to Result N). It is understood that a serial ADC arrangement 200 may be implemented as a stand-alone device or as part of another system (e.g., integrated with other components, systems, etc.).

Referring to FIG. 2, each of the multiple SH circuits 204 may be arranged to receive one or more analog signals (Ain0_0 through AinN_N). In one example implementation, one or more of the SH circuits 204 may be arranged to receive multiple concurrent analog input signals (Ain0_0 through AinN_N). It is noted that each of the SH circuits 204 may have the same number of input signals; however, at least some of the SH circuits 204 may have a different number of input signals X, Y and Z (i.e., Ain0_X, Ain1_Y, AinN_Z). In one example implementation, the input signals for each SH circuit 204 are multiplexed and forwarded to the MUX circuit 206.

In another example, a timing control signal is conveyed to each of the SH circuits 204, i.e. a timing control signal TC_0 is conveyed to the SH circuit SH 0, a timing control signal TC_1 is conveyed to the SH circuit SH 1 and a timing control signal TC_N is conveyed to the SH circuit SH N. According to an embodiment, the timing control signals TC_1 to TC_N are also fed to a unit 209, which triggers a conversion request signal to the ADC 102.

In an example implementation, the SH circuits 204 may be arranged to output a sample value based on at least one of the multiple analog signals (Ain0_0 through AinN_N) received. For example, the SH circuits 204 may sample an input analog signal (Ain0_0 through AinN_N) and output the value of the sample.

Figure 3:
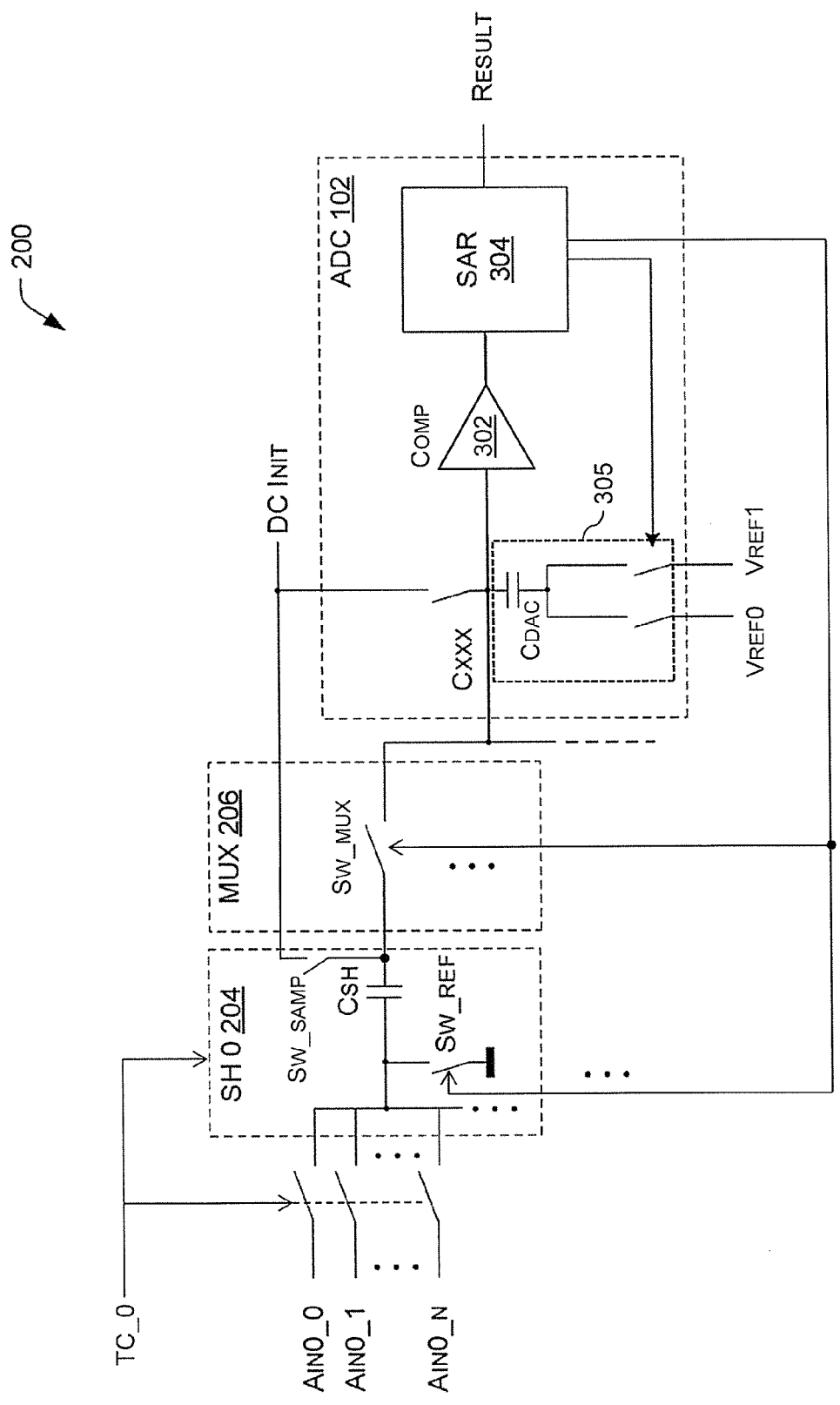
FIG. 3 is a schematic diagram of an example serial analog-to-digital conversion arrangement, according to an example implementation.

In an example implementation shown in FIG. 3, the SH circuits 204 are passive sample and hold circuits. The SH circuits 204 are composed of passive components, and are devoid of active components (e.g., amplifiers, etc.). In the example shown in FIG. 3, the SH 0 circuit 204 comprises a capacitor Csh, a switch Sw_samp and a switch Sw_ref. In other example implementations, an SH circuit 204 may comprise additional or alternate passive components. In an alternate implementation, a SH circuit 204 may contain one or more active components.

As shown in the schematic of FIG. 3, an analog input signal, such as Ain0_0, is sampled at the capacitor Csh of the SH circuit 204 by closing an input switch to the input (at Ain0_0, for example) and closing the sampling switch Sw_samp on the opposite side of the capacitor Csh. The end of the sample duration is determined by opening the sampling switch Sw_samp, for example. After sampling Ain0_0, the input switch (e.g., at Ain0_0) is opened.

In an example embodiment, the input switch (e.g., any of the switches that may connect Ain0_0, Ain0_1, . . . , Ain0_N to the capacitor Csh) as well as the SH circuit 204 are triggered via the timing control signal TC_0.

In this example, the capacitor Csh is charged to a value amounting to

Ain0_0–DC Init.

This value corresponds to a "sample value" that is output from the SH circuit 204 to the MUX 206 and to the ADC 102. In the example, the voltage DC Init may be an internal initialization voltage, independent from the conversion process and the analog inputs (Ain0_0 through AinN_N). The value of the voltage DC Init may in particular cancel out of the process during the conversion of the analog input (e.g., Ain0_0).

In one example implementation, a voltage divider (not shown) is employed at the SH circuit 204 to allow the ADC 102 to operate at a different voltage level than the voltage level of the analog input signals. For example, the voltage divider may be arranged to divide each of the plurality of analog input signals by a preselected value to scale the analog input signals. In such an implementation, the sample value output from the SH circuit 204 is the result of the voltage divider. In one example implementation, the capacitor Csh may be combined with other components (e.g., capacitors, resistors, etc.) to form the voltage divider. More specifically, in various implementations, the capacitors Csh and Cdac (Cdac is described in the following) may be chosen (sized) to achieve a desired scaling of the analog input signals. Furthermore, in various implementations, a resistive divider may be used as a voltage divider preceding the ADC 102 or directly associated with the input of the ADC 102. In one implementation, such resistive divider may precede the SH circuit 204, be a feature of in the SH circuit 204, precede the MUX 206, or be a feature of in the MUX 206.

In an example implementation, as shown in FIG. 2 and FIG. 3, the MUX circuit 206 is arranged to receive a plurality of outputs from the plurality of SH circuits 204 and sequentially make the outputs available for conversion by the ADC 102. For example, the MUX circuit 206 may be arranged to receive a quantity of sample values, including the sample value of each of the plurality of SH circuits 204, and to sequentially output each sample value of the quantity of sample values to the ADC 102.

In one implementation, as shown in FIG. 3, the MUX circuit 206 includes a multiplexer switch Sw_mux. In alternate implementations, the sampling switch Sw_samp may be located in the MUX circuit 206, or the like.

As shown in FIG. 3, the MUX circuit 206 couples the SH circuit 204 (and the corresponding sampled value) to the ADC 102 via the multiplexing switch Sw_mux. In various implementations, there is a multiplexing switch Sw_mux associated with each SH circuit 204 in the serial ADC arrangement 200. The MUX circuit 206 allows several SH circuits 204 to be coupled to the ADC 102, for sequential conversion of the outputs of the SH circuits 204. Further, the same sample duration may be applied for each of the SH circuits 204 by controlling the sample duration via the sample switch Sw_samp (i.e., closing the switch Sw_samp for a duration while multiple SH circuits 204 are coupled to input analog signals and opening it to conclude the sampling time for each of the coupled SH circuits 204).

In an embodiment, the timing control signals TC_0 to TC_N can be individually adjusted for each of the SH circuits 204.

When, for example, SH 0 is to be coupled to the ADC 102, and the sample value at the output of SH 0 is to be converted by the ADC 102, the multiplexing switch Sw_mux associated with SH 0 is closed. In an implementation, closing Sw_mux couples the capacitor Csh to a high-impedance node Cxxx of the ADC 102, which may be located at the input of a comparator 302 of the ADC 102.

In one example implementation, to initialize conversion of the sampled value, the input side of the capacitor Csh is coupled to the reference ground potential of the input by closing the switch Sw_ref. This action causes a voltage shift at the node Cxxx. In an example, the voltage shift initiates a conversion process within the ADC 102.

In an example implementation, the interface 202 comprises the components of the SH circuits 204 and the MUX circuit 206. In other implementations, the components discussed with reference to the SH circuits 204 and the MUX 206, or the like, may be distributed or integrated differently. In an implementation, the components of the interface 202 are passive components.

In an example implementation, as shown in FIG. 2 and FIG. 3, the ADC 102 is arranged to sequentially convert each sample value received to a respective digital result. In other words, the ADC 102 is arranged to sequentially convert the multiple parallel analog inputs into digital form. In an implementation, the ADC 102 output is a sequence of digital results corresponding to the sequence of the multiplexed inputs (i.e., sample values output from the SH circuits 204).

In one example implementation, the ADC 102 comprises a successive approximation ADC (SA-ADC). In another example implementation, as shown in FIG. 3, the ADC 102 comprises a switched-capacitor type SA-ADC. For example, the ADC 102 comprises a digital-to-analog conversion (DAC) circuit 305 comprising a switched capacitor Cdac, the comparator 302, and a successive approximation register (SAR) 304.

The switches Sw_ref and Sw_mux may be controlled via the SAR 304.

As described previously, to initialize conversion of the sampled value by the ADC 102, the input side of the capacitor Csh is coupled to the reference ground potential of the input (e.g., Ain0_0) by closing the switch Sw_ref. This action causes a voltage shift at the node Cxxx, which is the high-impedance input node of the ADC 102 and the comparator 302. The voltage shift is compensated by a search algorithm involving the comparator 302 and the SAR 304. The capacitor Cdac enables the search described as follows. In an implementation, as shown in FIG. 3, the value DC Init may be added to the input of the comparator 302, cancelling out the addition of the value DC Init to the sample value charged to capacitor Csh, as described above.

In an example implementation, the ADC 102 uses a successive approximation (SA) algorithm to convert sample values to digital results via a binary search. The binary search is conducted through some or all possible quantization levels, and may eventually converge on a digital result for the conversion. For example, referring to FIG. 3, the SAR 304 is initialized so that the most significant bit (MSB) is equal to a digital 1. This digital code is output to the DAC circuit (e.g., the switched capacitor Cdac and multiple parallel switches enabling Vref0 and Vref1), which approximates the digital code to an analog value. In one example, the analog value at this point is approximately equal to one of Vref0 or Vref1 divided by 2.

The analog approximation from the DAC circuit is received by the comparator 302 to be compared with the sample value. If the analog approximation is greater than the sample value, the comparator 302 causes the SAR 304 to clear the MSB to zero, otherwise the bit remains as a 1.

The next bit (e.g., next most significant bit) in the SAR 304 is set to 1, and the same test is performed, with the DAC circuit feeding an analog approximation of the new resulting code to the comparator 302. If the analog approximation is greater than the sample value, the comparator 302 causes the SAR 304 to clear this bit to zero, otherwise the bit remains as a 1. This binary search is continued until every bit in the SAR 302 has been used. In an implementation, the resulting code in the SAR 304 is the digital result (i.e., digital conversion of the sample value). This digital result is output by the ADC 102 via the SAR 304.

In an example embodiment, the comparator 302 compares a voltage at the node Cxxx with a voltage from a previous measurement at this node Cxxx.

Resolution of the ADC 102 may be defined based on a minimum voltage level required to cause a change in the output code (e.g., a clear of a bit from 1 to 0 in the SAR 304). For example, the minimum voltage that causes a change in the digital code is the least significant bit (LSB) of the ADC 102. The resolution of the ADC 102 is the LSB voltage. In alternate implementations, other algorithms may be used, or variations of the algorithm(s) described may be used to determine the digital result.

In one example implementation, the core components of the ADC 102 operate in a low voltage domain. For example, the comparator 302 and the SAR 304 may be arranged to operate at 5 volts, 3 volts, 1.5 volts, or the like. Operation of the core components of the ADC 102 at lower voltages may be combined with dividing the voltage of the input analog signals, as discussed above, in some implementations. Operation of the core components at lower voltages and/or voltage division of the input analog signals may contribute to power savings by the serial ADC arrangement 200.

In one example implementation, as shown in FIG. 2, a demultiplexer (DE-MUX) 208 is included in the serial ADC arrangement 200. In an implementation, the DE-MUX 208 is arranged to direct each digital result output from the ADC 102 to at least one out of N parallel result channels. For example, as described above, the DE-MUX 208 de-multiplexes the common result from the ADC 102, and restores the digital outputs to the respective result channel. In other words, a digital output that is a result of an analog input from one of the SH circuits 204 is directed to a result channel associated with that SH circuit 204 (e.g., digital result channel Result 0 is directed to the result channel associated with the SH circuit SH 0). Accordingly, with a DE-MUX 208, the serial ADC arrangement 200 receives multiple parallel inputs and outputs multiple parallel results.

In various implementations, additional or alternative components may be used to accomplish the disclosed techniques and arrangements.

Exemplary Process

Figure 4:
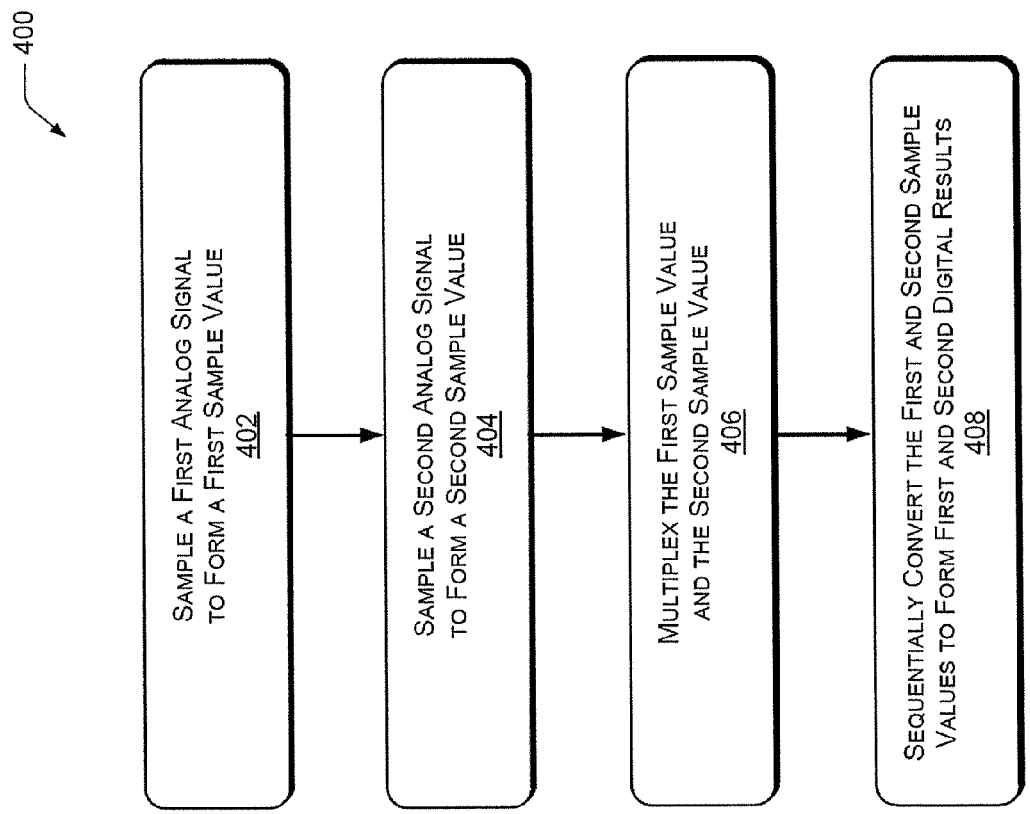
FIG. 4 is a flow diagram illustrating an example process for providing analog to digital conversion of multiple parallel analog inputs, according to an example implementation.

FIG. 4 is a flow diagram illustrating an example process or method 400 for providing analog to digital conversion of multiple parallel analog inputs, according to an implementation. The method 400 describes coupling an input interface to a single analog-to-digital converter (ADC) (such as ADC 102). For example, the interface may comprise a plurality of parallel sample and hold (SH) circuits (such as SH circuits 204). The ADC may be arranged to sequentially convert sample values output from the interface (e.g., the plurality of parallel SH circuits) to digital results. In one example, the plurality of parallel SH circuits are coupled to the ADC via a multiplexer circuit (such as MUX circuit 206) arranged to organize the sample values into a sequential form. The method 400 is described with reference to FIGS. 1 to 3, however it is appreciated that other arrangements and variations of the above arrangements can be used with the method 400.

The order in which the method/process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At a block 402, the method 400 includes sampling a first analog signal at a first sample and hold (SH) circuit to form a first sample value.

At a block 404, the method 400 includes sampling a second analog signal at a second SH circuit to form a second sample value. In various implementations, the first and second analog signals are parallel input signals. In an implementation, the process includes sampling the first and second analog signals concurrently or at least partially concurrently.

In an example implementation, the first and second analog signals are sampled using passive components and/or circuits. For example, the first and second analog signals may be sampled via a capacitor (such as capacitor Csh). One or more switches may be used to initiate sampling and to determine the sampling duration.

In an example implementation, the method includes dividing a value of the first analog signal and/or the second analog signal by a preselected value to scale the first analog signal and/or the second analog signal. For example, the value of the first and/or second analog signals may be a voltage level. In an implementation, the first analog signal and/or the second analog signal may be scaled via one or more capacitive, resistive, or combination voltage dividers (e.g., voltage dividers having capacitive and resistive elements).

At a block 406, the method 400 includes multiplexing the first sample value and the second sample value. For example, the first and second sample values may be organized into a sequence. In one implementation, the first and second sample values are multiplexed via multiplexer switches. In one example, each SH circuit has an associated multiplexer switch that is arranged to couple the SH circuit to the ADC and to couple the sample values to the input of the ADC. In an alternate implementation, one or more multiplexer switches may be shared among multiple SH circuits.

At a block 408, the method 400 includes sequentially converting the first sample value to form a first digital result and the second sample value to form a second digital result via an analog-to-digital converter (ADC). In one implementation, the first sample value is converted to form a first digital result and the second sample value is converted to form a second digital result using a successive approximation algorithm. In alternate implementations, other types of algorithms are used to convert the first and second sample values and/or other types of ADCs may be employed.

In an example implementation, the first and second analog signals are among multiple analog signals received by multiple SH circuits. For example, in one implementation, the process includes sampling a third analog signal at a third sample and hold (SH) circuit to form a third sample value; multiplexing the third sample value with the first sample value and the second sample value; and sequentially converting the third sample value to form a third digital result via the ADC, in sequence with the first sample value and the second sample value.

In another example implementation, the method 400 may comprise receiving a plurality of analog inputs at the first SH circuit and/or the second SH circuit, sampling the plurality of analog inputs to form a plurality of sample values, multiplexing the plurality of sample values, and sequentially converting the plurality of sample values to form digital results via the ADC.

In one example implementation, the method 400 may comprise de-multiplexing the first digital result to a first result channel and the second digital result to a second result channel. In a further implementation, each SH circuit is associated with a input channel, and each output of the ADC is directed (e.g., de-multiplexed) to a result channel associated with the respective SH circuit that provided the sample value corresponding to the output. In one implementation, a de-multiplexer is coupled to the output of the ADC to de-multiplex the outputs of the ADC.

In various implementations, the method 400 may comprise storing the first digital result and/or the second digital result (and/or the third digital result, successive digital results, etc.) in one or more storage registers. In one example implementation, each input channel may be associated with a separate storage register. For example, the digital results may be de-multiplexed from the output of the ADC into storage registers corresponding to their associated input channels.

In alternate implementations, other techniques may be included in the method 400 in various combinations, and remain within the scope of the disclosure.

Example

Several Conversions Based on a Single Sample Phase

Two time sequences may be used in devices, e.g., semiconductor devices, microcontrollers, etc. that provide analog-to-digital conversion functionality:
  (a) a sampling phase: Connecting a sampling capacitor to an input at the beginning of the sampling phase, open an input switch at a (e.g., (pre-)determined) sample time point (e.g., to determine an end of the sampling phase).
  (b) a conversion phase: Connecting a search capacitor to a reference voltage and vary a digital combination of a feedback digital-to-analog conversion (DAC) to find a suitable conversion result.

With regard to FIG. 3, the sampling capacitor may be the capacitor Csh, the input switch may be the connection to the analog signal (Ain0_0 through Ain0_N), the search capacitor may be the capacitor Cdac, the reference voltage may be DC Init and the feedback DAC variation may be supplied via the SAR 304 controlling the voltage applied to the capacitor Cdac.

The sequence of the sampling phase and the conversion phase may be utilized in various kinds of ADCs, in particular SAR ADCs.

Figure 5:
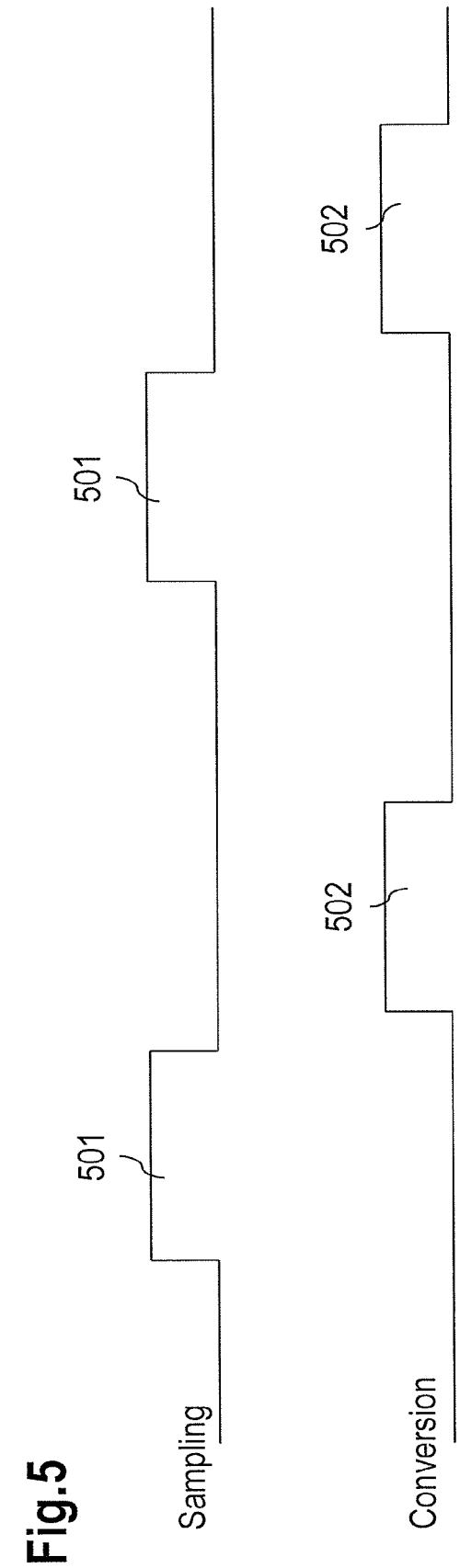
FIG. 5 shows an exemplary timing diagram comprising a sampling phase and a conversion phase.

FIG. 5 shows an exemplary timing diagram comprising a sampling phase 501 and a conversion phase 502.

The example presented may be used to reduce the noise in the reference voltage. In addition, examples may introduce an efficient self-diagnosis to provide a safety integrity level. Such self-diagnosis may efficiently control, monitor or utilize the reference voltage.

Embodiments presented may utilize a switched capacitor ADC's input voltage being at least partially stored in the sampling capacitor. In case the conversion process does not destroy the charge stored, it is possible to apply several conversion processes on a single sample.

There are several types of ADCs that allow for non-charge destroying conversion, e.g., SAR ADC, tracking ADC, flash ADC, etc.

Figure 6:
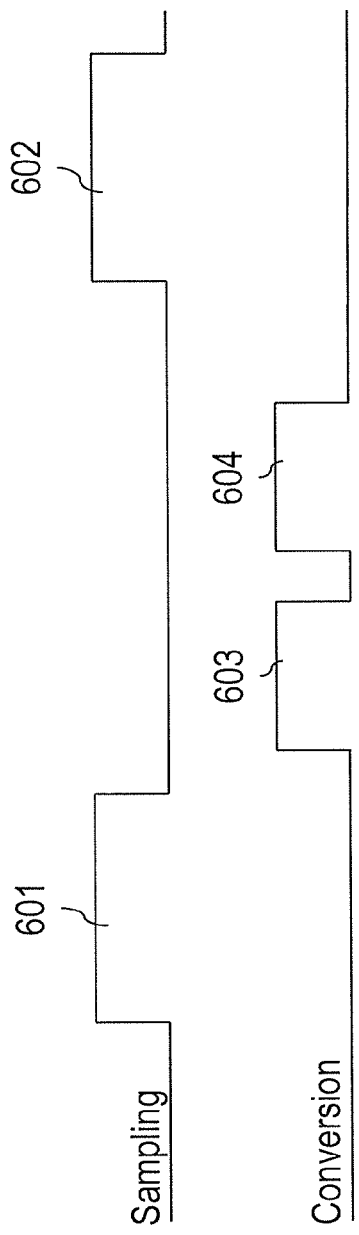
FIG. 6 shows an exemplary timing diagram comprising a sequence of several conversion phases based on one sampling phase.

FIG. 6 shows an exemplary timing diagram comprising a sequence of several conversion phases based on one sampling phase.

After a sampling phase 601, two conversion phases 603 and 604 are applied to the sampled value. The sequence comprising the conversion phases 603 and 604 may use the same reference and the results of the conversion phases 603 and 604 may in particular be further processed, e.g., averaged. The same may apply for a subsequent sampling phase 602.

It is noted that the number of conversions utilizing a single sampling phase is not limited to two. It is hence feasible to conduct several conversion phases based on a single sampling phase, in particular as long as the charge stored in the sampling capacitor is still suitable, in particular accurate enough to allow for suitable results.

The conversion phase 603 may be applied to a reference voltage A and the conversion phase 604 may be applied to a reference voltage B. This enables redundant conversions 603 and 604 on different reference voltages A and B, which may be utilized, e.g., for self-diagnosis purposes.

Hence, the example presented utilizes several conversion steps that are based on a single sample of the input voltage. The several conversion steps may be used for reducing noise at the reference or the comparator. Also, the several conversion steps may be used for (redundant) self-diagnosis, e.g., by conducting conversions with different reference sources. For example, a reference source can be used for a subsequent (e.g., second) conversion step dependent on the previous (e.g., first) result.

Figure 7:
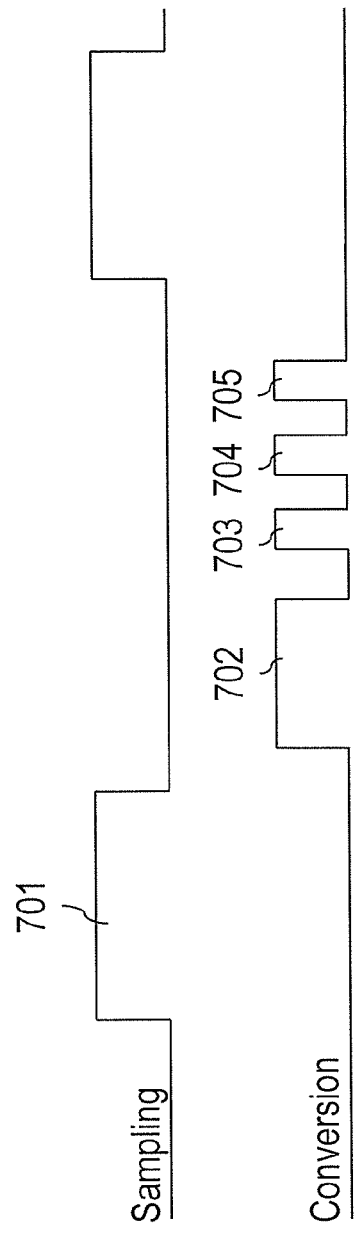
FIG. 7 shows an exemplary timing diagram comprising a sequence of several conversion phases based on one sampling phase, wherein the conversion phases may in particular be different.

FIG. 7 shows an exemplary timing diagram comprising a sequence of several conversion phases based on one sampling phase, wherein the conversion phases may in particular be different. This example also allows for an efficient noise reduction of the reference voltage.

Based on a sampling phase 701, a conversion phase 702 is conducted. This conversion phase 702 can be a "normal", i.e. full conversion or full range. After that conversion phase 702, three conversion phases 703, 704 and 705 are conducted with a reduced range of the input signal. The conversion phases 703 to 705 can be used for LSB conversion (also referred to as "LSB conversion phases"). Hence, in each of the conversion phases 703 to 705 a number of LSBs (e.g., eight LSBs) can be converted. Also, in each of the conversion phases 703 to 705 a different number of LSBs can be converted.

Advantageously, the LSB conversion phases may be applied in a search window around the conversion phase 702, which results in limited variation of the LSB conversion phases due to noise.

This approach may be used in an SAR ADC and will result in a faster overall approach to achieve the conversion result(s). The final result of the conversion may be subject to averaging of the conversion phases 703 to 705.

In some types of ADC, the sample capacitor may be separated from the search capacitor (e.g., passive Sample and Hold ADC), which may increase the design possibilities for applying the proposed approach. However, several conversion steps can also be conducted on architectures in which the sample capacitor is identical to the search capacitor.

Further, the second conversion phase (also the LSB conversion phases) can be applied to a different reference (e.g., voltage), wherein the value of the reference may depend on the first result. This allows for increasing the resolution of the achieved result.

In an exemplary embodiment, a first sequence of conversions may be started at the end of the sampling phase for a first input signal and a second (e.g., different) conversion sequence may be started at the end of the sampling phase for a second input channel.

It is also an option that a first sequence of conversions is started after the end of the sampling phase of an input channel and a second (different) sequence of conversions may be started after the end of a subsequent sampling phase on the same input channel.

It is in particular an option that the conversion phases for different sampling phases are interleaved. Hence, several conversions can be conducted for one sample (based on one or more sampling phases) or for several samples. It may in particular be an option to provide more than one ADCs to trigger more than one conversion requests in parallel. The conversion requests can be directed to the sample as a whole or to a portion of the sample, e.g., a reduced range of the sample (e.g., a number of k least bits).

The solution presented bears in particular the advantage that conversions and/or partial conversions can be repeated (after one another) without the necessity of a new sampling phase. The results of the conversions and/or partial conversions can be processed, e.g., numerically combined, stored for further (later) processing, etc.

The examples suggested herein may in particular be based on at least one of the following solutions. In particular combinations of the following features could be utilized in order to reach a desired result. The features of the method could be combined with any feature(s) of the device, apparatus or system or vice versa.

A method is suggested comprising the steps:
sampling an analog signal at a sample and hold circuit to form a sample value;
converting the sample value to form a first digital result;
converting the sample value to form a second digital result.

This approach allows to efficiently obtain digital results based on a single sample value of an analog signal. The conversions may use different reference signals (e.g., reference voltages) or identical reference signals. The reference signal may be provided internally by the analog-to-digital converter in which the method may be utilized or externally, e.g., for self-diagnosis or comparison purposes.

In an embodiment, the method further comprises:
processing the first digital result and the second digital result into a combined result.

In an embodiment, said processing comprises an averaging of the first digital result and the second digital result.

In an embodiment, the method further comprises:
converting the sample value to form at least one third digital result;
processing the first digital result, the second digital result and the at least one third digital result.

It is noted that several conversions may be conducted based on one sample value. The number of conversions is not limited to two or three.

In an embodiment, the method further comprises:
converting the sample value to form at least one third digital result as long as a charge stored in at least one sampling capacitor provides for suitable results.

In an embodiment, the method further comprises:
converting the sample value to form the first digital result based on a first reference signal;
converting the sample value to form the second digital result based on a second reference signal.

Each of the reference signals may be a reference voltage that may be provided internally by a device conducting the conversion or by an external signal source. The reference signal can be used for comparison with the sample value. For several conversions, identical or different reference signals can be used.

In an embodiment, said method is applied in an analog-to-digital converter that allows for substantially maintaining a charge stored in at least one sampling capacitor.

In an embodiment, the analog-to-digital converter is one of the following types:
a successive approximation register analog-to-digital converter;
a tracking analog-to-digital converter;
a flash analog-to-digital converter.

In an embodiment, the method further comprises:
converting the full sample value to form the first digital result;
converting the sample value to form a reduced range of the second digital result.

The reduced range of the sample value may correspond to a predetermined number of least significant bits (LSBs). Hence, the second digital result may provide said predetermined number of LSBs.

In an embodiment, the method further comprises:
converting the full sample value to form the first digital result;
converting the sample value to form a reduced range of the second digital result;
converting the sample value to form a third digital result.

Hence, the second digital result and/or the third digital result may have a reduced range compared to the first digital result. It is in particular an option that the reduced range of the second digital result and the third digital result each comprise a number of LSBs of the first digital result.

It is noted that several additional conversions with the full sample value and/or a reduced sample value may be conducted. The results of the conversions may be further processed in various ways.

In an embodiment, the first reduced range of the sample value and the second reduced range of the sample value are identical.

In an embodiment, the first reduced range of the sample value and the second reduced range of the sample value are different.

In an embodiment, the method further comprises:
converting the sample value to form the first digital result using a successive approximation algorithm;
converting the sample value to form the second digital result using a successive approximation algorithm.

In an embodiment, converting the sample value is conducted in a tracking mode.

The tracking mode may provide a LSB per conversion. It is another option that the tracking mode is used only for forming the second digital result.

A device is provided, the device comprising:
a sample and hold circuit to form a sample value based on an analog signal;
a processing unit arranged for
converting the sample value to form a first digital result;
converting the sample value to form a second digital result.

In an embodiment, the processing unit comprises an analog-to-digital conversion unit with a comparator and a successive approximation register that are arranged to successively compare the sample value with a reference signal.

In an embodiment, the processing unit is arranged for processing the first digital result and the second digital result into a combined result.

In an embodiment, the processing unit is arranged for
converting the full sample value to form the first digital result;
converting a reduced range of the sample value to form the second digital result.

In an embodiment, the processing unit is arranged for
converting the full sample value to form the first digital result;
converting a first reduced range of the sample value to form the second digital result;
converting a second reduced range of the sample value to form a third digital result.

In an embodiment, the first reduced range of the sample value and the second reduced range of the sample value are different or identical.

In an embodiment, the processing unit is further arranged for:
converting the sample value to form the first digital result based on a first reference signal;
converting the sample value to form the second digital result based on a second reference signal.

A device is provided for providing digital results based an analog signal, the device comprising:
means for sampling the analog signal at a sample and hold circuit to form a sample value;
means for converting the sample value to form a first digital result;
means for converting the sample value to form a second digital result.

A method is disclosed. An analog signal is sampled to form a sample value using a sample and hold circuit. The sample value is converted to form a first digital result. The sample value is converted to form a second digital result.

A device includes a sample and hold circuit and a processing unit. The sample and hold circuit is configured to form a sample value based on an analog signal. The processing unit is configured to convert the sample value to form a first digital result and to convert the sample value to form a second digital result.

A device for providing digital results based on an analog signal is disclosed. The device includes a means for sampling the analog signal at a sample and hold circuit to form a sample value, a means for converting the sample value to form a first digital result and a means for converting the sample value to form a second digital result.

Although various exemplary embodiments have been disclosed, it will be apparent to those skilled in the art that various changes and modifications can be made which will achieve some of the advantages without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method comprising:
sampling an analog signal at a sample and hold circuit to form a sample value;
converting the sample value to form a first digital result;
converting the sample value to form a second digital result;
performing a full conversion when converting the sample value to form the first digital result; and
using a reduced range when converting the sample value to form the second digital result.

2. The method according to claim 1, further comprising:
processing the first digital result and the second digital result into a combined result.

3. The method according to claim 2, wherein said processing comprises averaging the first digital result and the second digital result.

4. The method according to claim 1, further comprising:
converting the sample value to form at least one third digital result; and
processing the first digital result, the second digital result and the at least one third digital result.

5. The method according to claim 4, further comprising:
converting the sample value to form at least one third digital result.

6. The method according to claim 1, further comprising:
converting the sample value to form the first digital result based on a first reference signal;
converting the sample value to form the second digital result based on a second reference signal.

7. The method according to claim 1, wherein the method is applied in an analog-to-digital converter that allows for substantially maintaining a charge stored in at least one sampling capacitor.

8. The method according to claim 7, wherein the analog-to-digital converter is from one of the following types:
a successive approximation register analog-to-digital converter;
a tracking analog-to-digital converter; and
a flash analog-to-digital converter.

9. The method according to claim 1, further comprising:
using a first reduced range when converting the sample value to form the first digital result;
using a second reduced range when converting the sample value to form the second digital result; and
converting the sample value to form a third digital result.

10. The method according to claim 9, wherein the first reduced range of the sample value and the second reduced range of the sample value are identical.

11. The method according to claim 9, wherein the first reduced range of the sample value and the second reduced range of the sample value are different.

12. The method according to claim 1, further comprising:
using a successive approximation algorithm when converting the sample value to form the first digital result;
using a successive approximation algorithm when converting the sample value to form the second digital result.

13. The method according to claim 12, wherein converting the sample value is conducted in a tracking mode.

14. A device comprising:
a sample and hold circuit configured to form a sample value based on an analog signal; and
a processing unit configured to convert the sample value to form a first digital result and to convert the sample value to form a second digital result;
wherein the processing unit is configured to use a full range to convert the sample value to form the first digital result and to use a reduced range to convert the sample value to form the second digital result.

15. The device according to claim 14, wherein the processing unit comprises an analog-to-digital conversion unit with a comparator and a successive approximation register that are arranged to successively compare the sample value with a reference signal.

16. The device according to claim 14, wherein the processing unit is configured to process the first digital result and the second digital result into a combined result.

17. The device according to claim 14, wherein the processing unit is configured to use a full range of a conversion phase to convert the sample value to form the first digital result, to use a first reduced range of the conversion phase to convert the sample value to form the second digital result and to use a second reduced range of the conversion phase to convert the sample value to form a third digital result.

18. The device according to claim 17, wherein the first reduced range and the second reduced range are different.

19. The device according to claim 14, wherein the processing unit is configured to convert the sample value to form the first digital result based on a first reference signal and convert the sample value to form the second digital result based on a second reference signal.

20. The device according to claim 14, further comprising:
a means for converting the sample value to form a third digital result.

21. A device for providing digital results based on an analog signal, comprising:
means for sampling the analog signal at a sample and hold circuit to form a sample value;
means for converting the sample value to form a first digital result; and
means for converting the sample value to form a second digital result, wherein the means for converting is configured to use a full range to convert the sample value to form the first digital result and to use a reduced range to convert the sample value to form the second digital result.

* * * * *